(12) United States Patent
Gupta et al.

(10) Patent No.: US 10,078,496 B2
(45) Date of Patent: Sep. 18, 2018

(54) MAGNETIC TUNNEL JUNCTION (MTJ) BASED TRUE RANDOM NUMBER GENERATORS (TRNG)

(71) Applicant: INTERNATIONAL BUSINESS MACHINES CORPORATION, Armonk, NY (US)

(72) Inventors: Suyog Gupta, Sunnyvale, CA (US); Chandrasekharan Kothandaraman, New York, NY (US); Jonathan Z. Sun, Shrub Oak, NY (US)

(73) Assignee: International Business Machines Corporation, Armonk, NY (US)

( * ) Notice: Subject to any disclaimer, the term of this patent is extended or adjusted under 35 U.S.C. 154(b) by 19 days.

(21) Appl. No.: 15/440,278

(22) Filed: Feb. 23, 2017

(65) Prior Publication Data
US 2018/0239590 A1    Aug. 23, 2018

(51) Int. Cl.
| | |
|---|---|
| *G11C 11/00* | (2006.01) |
| *G06F 7/58* | (2006.01) |
| *H01L 43/02* | (2006.01) |
| *H01L 43/12* | (2006.01) |
| *H01L 43/10* | (2006.01) |
| *H01F 10/08* | (2006.01) |

(52) U.S. Cl.
CPC ............. *G06F 7/588* (2013.01); *H01F 10/08* (2013.01); *H01L 43/02* (2013.01); *H01L 43/10* (2013.01); *H01L 43/12* (2013.01)

(58) Field of Classification Search
CPC ......... G11C 11/48; G11C 11/15; G11C 11/16; G11C 11/52

USPC .................................. 365/158, 171, 173, 148
See application file for complete search history.

(56) References Cited

U.S. PATENT DOCUMENTS

| | | | |
|---|---|---|---|
| 6,542,014 B1 * | 4/2003 | Saito | G06F 7/588 327/164 |
| 6,774,734 B2 | 8/2004 | Christensen et al. | |
| 6,834,009 B1 * | 12/2004 | Yue | H03K 19/1778 365/185.05 |
| 8,351,603 B2 | 1/2013 | Oishi et al. | |
| 8,374,012 B2 | 2/2013 | Kanai et al. | |
| 9,087,593 B2 | 7/2015 | Wang et al. | |

(Continued)

OTHER PUBLICATIONS

Barangi et al., "Straintronics-Based True Random Number Generator for High-Speed and Energy-Limited Applications", IEEE Transactions on Magnetics, vol. 52, No. 1. Sep. 14, 2015. pp. 1-9.

(Continued)

*Primary Examiner* — Han Yang
(74) *Attorney, Agent, or Firm* — Tutunjian & Bitetto, P.C.; Vazken Alexanian

(57) ABSTRACT

An apparatus is presented for generating a true random number generator (TRNG). The apparatus includes a magnetic tunnel junction (MTJ) device including a first layer, a second layer, and third layer, as well as a bias circuit to bias the MTJ device along with a pulse height discriminator and a time-to-amplitude convertor to generate random bitstreams. The second layer is a barrier layer with an energy barrier height in the order of 20 kT, where k is the Boltzmann constant and T is the absolute temperature. Random flipping of an orientation of magnetization of the third layer is induced by thermal fluctuations in the MTJ device.

20 Claims, 4 Drawing Sheets

(56) References Cited

U.S. PATENT DOCUMENTS

| | | | |
|---|---|---|---|
| 9,110,746 B2 | 8/2015 | Zhu et al. | |
| 2010/0174766 A1* | 7/2010 | Weeks | G06F 7/588 |
| | | | 708/255 |
| 2011/0123022 A1* | 5/2011 | Oishi | G06F 7/588 |
| | | | 380/46 |
| 2014/0067890 A1 | 3/2014 | Zhu et al. | |
| 2014/0108478 A1 | 4/2014 | Lee et al. | |
| 2016/0202954 A1 | 7/2016 | Manipatruni et al. | |

OTHER PUBLICATIONS

Choi et al., "A Magnetic Tunnel Junction Based True Random Number Generator with Conditional Perturb and Real-Time Output Probability Tracking", IEEE International Electron Devices Meeting. Dec. 15-17, 2014. pp. 1-4.

Fong et al., "Generating True Random Numbers Using On-chip Complementary Polarizer Spin-Transfer Torque Magnetic Tunnel Junctions", 2014 72nd Annual Device Research Conference. Jun. 22-25, 2014. pp. 1-2.

Fukushima et al., "Spin dice (physical random number generator using spin torque switching) and its thermal response", 2015 IEEE International Magentics Conference. May 11-15, 2015. p. 1.

Kim et al., "Spin-Orbit-Torque-Based Spin-Dice: A True Random-Number Generator", IEEE Magnetics Letters, vol. 6. Oct. 30, 2015. pp. 1-4.

Yang et al., "A Robust-40 to 120° C. All-Digital True Random Number Generator in 40nm CMOS", 2015 Symposium on VLSI Circuits Digest of Technical Papers. Jun. 17-19, 2015. pp. C248-C249.

\* cited by examiner

MAGNETIC TUNNEL JUNCTION (MTJ) BASED TRUE RANDOM NUMBER GENERATORS (TRNG)

BACKGROUND

Technical Field

The present invention relates generally to semiconductor devices, and more specifically, to magnetic tunnel junction (MTJ) based true random number generators (TRNG).

Description of the Related Art

Unlike conventional random access memory (RAM) chip technologies, magnetic RAM (MRAM) does not store data as electric charge, but instead stores data by magnetic polarization of storage elements. Typically, storage elements are formed from two ferromagnetic layers separated by a tunneling layer. One of the ferromagnetic layers has at least one pinned magnetic polarization (or fixed layer) set to a particular polarity. The magnetic polarity of the other ferromagnetic layer (or free layer) is altered to represent either a "1" (e.g., anti-parallel polarity to the fixed layer) or "0" (e.g., parallel polarity to the fixed layer). One device having a fixed layer, a tunneling layer, and a free layer is a magnetic tunnel junction (MTJ). The electrical resistance of a MTJ is dependent on the magnetic polarity of the free layer compared to the magnetic polarity of the fixed layer. A memory device such as MRAM can be built from an array of individually addressable MTJs.

SUMMARY

In accordance with an embodiment, a method is provided for constructing a true random number generator (TRNG). The method includes forming a reference layer, forming a barrier layer, and forming a free layer, wherein energy separating two stable states of the free layer includes a thermal activation energy difference such that the states oscillate under a voltage bias to generate random outputs.

In accordance with another embodiment, an apparatus is provided for generating a true random number generator (TRNG). The apparatus includes a magnetic tunnel junctions including a magnetic tunnel junction (MTJ) device including a reference layer, a barrier layer, and a free layer, wherein energy separating two stable states of the free layer includes a thermal activation energy difference such that the states oscillate under a voltage bias to generate random outputs.

In accordance with another embodiment, an apparatus is provided for generating a true random number generator (TRNG). The apparatus includes a magnetic tunnel junction (MTJ) device including a first layer, a second layer, and third layer, as well as a bias circuit to bias the MTJ along with a pulse height discriminator and a time to amplitude convertor to generate random bit-streams.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein.

Throughout the drawings, same or similar reference numerals represent the same or similar elements.

DETAILED DESCRIPTION

Figure 1:
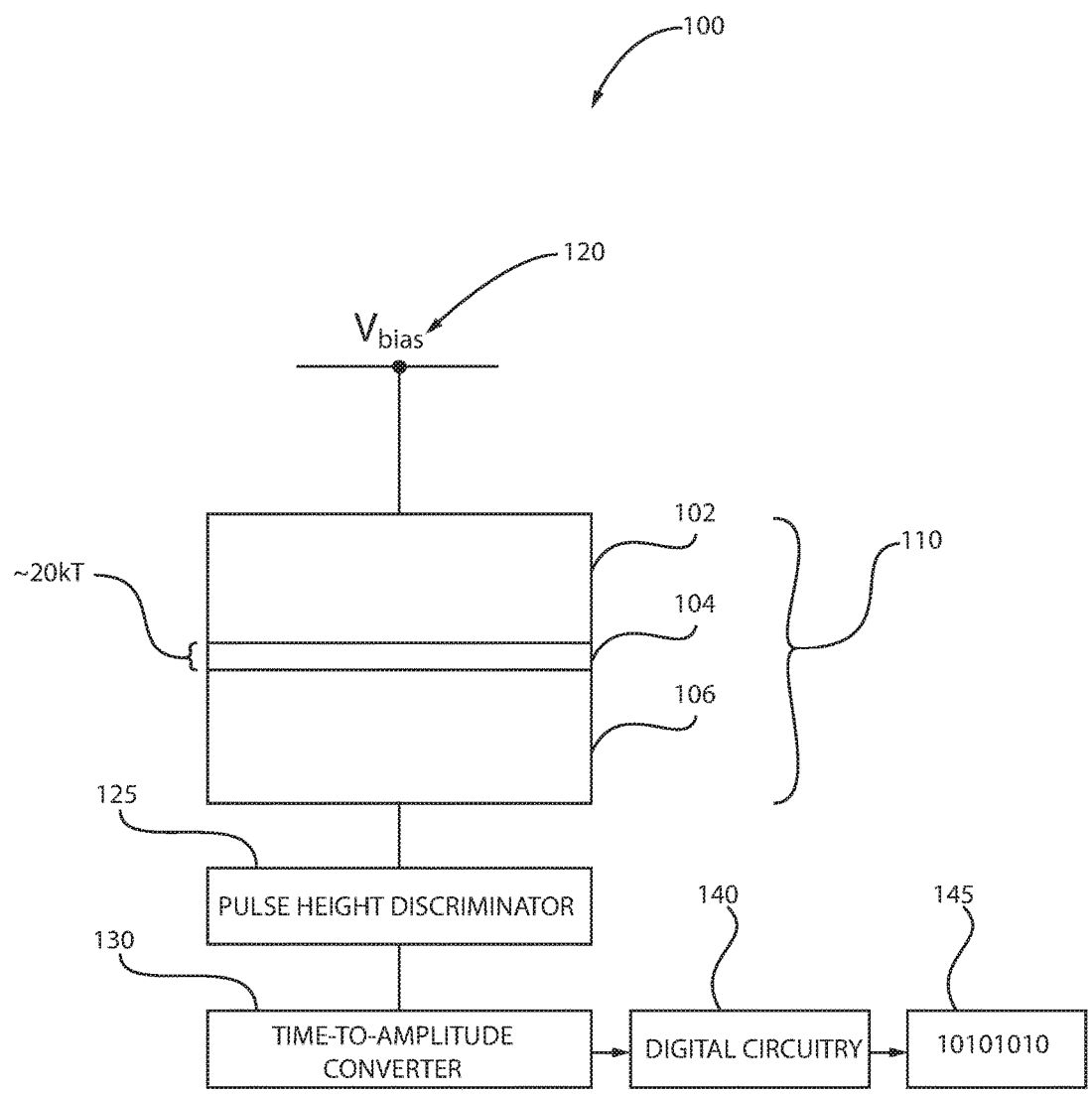
FIG. 1 is a magnetic tunnel junction (MTJ) structure including functional elements for generating random numbers, in accordance with an embodiment of the present invention.

Embodiments in accordance with the present invention provide methods and devices for generating a true random number generator (TRNG). The TRNG can be formed by employing a magnetic tunnel junction (MTJ) device. The MTJ device includes, e.g., three layers, that is, a reference layer, a barrier layer, and a free layer. The free layer has two states. Energy separating the two stable states of the free layer include a thermal activation energy difference such that the states oscillate under a voltage bias to generate random outputs. In useful embodiments, energy separating the two stable states of the free layer is small compared to the thermal activation energy. In one example, the energy barrier height is about 20 kT (where k is the Boltzmann constant and T is the absolute temperature). Random flipping of an orientation of magnetization of the free layer can be induced by thermal fluctuations in the MTJ device. Additionally, agitation noise can be used to randomly switch the orientation of magnetization of the free layer.

Embodiments in accordance with the present invention provide methods and devices for biasing the MTJ device by a voltage signal such that resulting pulses can be converted into a random bit-stream by use of, e.g., a pulse discriminator and a time-to-amplitude converter.

Embodiments in accordance with the present invention provide methods and devices for providing an MTJ device having a low energy barrier between the two stable states of the free layer, advantageously enabled by low magnetic anisotropy energy, to permit a fast and low power random generator that flips randomly due to thermal agitation in the system. Thus, there is no need to apply engineered pulses to the MTJ device to electrically switch its state. In one useful embodiment, the MTJ device can be connected to a read-out circuit that converts the random orientation of the free layer of the MTJ device by converting it to an electrically readable signal that is converted to a bit stream. Additionally, there is no need to deliberately write a pulse voltage. Instead, the thermal agitation noise in the MTJ device is advantageously used to flip the magnetic orientation of the free layer of the MTJ device. A pulse height discriminator and a time-to-amplitude converter can be connected with the MTJ device in order to convert the random orientation of the free layer into bit streams. As a result, low MTJs with low energy barrier (Eb) stacks can improve the rate of generation of random flipping events and controlling the bias voltage can help generate a sufficient rate of flips. The time-to-amplitude converter and the read-out circuit can generate the true random numbers. The flips can be in the order of nanoseconds (ns) to several nanoseconds to enable a quick way to produce the true-random-numbers.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor.

The term "direct contact" or "directly on" means that a first element, such as a first structure, and a second element, such as a second structure, are connected without any intermediary conducting, insulating or semiconductor layers at the interface of the two elements.

The terms "overlying", "atop", "positioned on" or "positioned atop" means that a first element, such as a first structure, is present on a second element, such as a second structure, wherein intervening elements, such as an interface structure can be present between the first element and the second element.

The term "electrically connected" means either directly electrically connected, or indirectly electrically connected, such that intervening elements are present; in an indirect electrical connection, the intervening elements can include inductors and/or transformers.

As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

The term "processing" as used herein includes deposition of material or photoresist, patterning, exposure, development, etching, cleaning, stripping, implanting, doping, stressing, layering, and/or removal of the material or photoresist as required in forming a described structure.

As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The word "exemplary" is used herein to mean "serving as an example, instance, or illustration," Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this invention.

The present subject matter will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

FIG. 1 is a magnetic tunnel junction (MTJ) structure including functional elements for generating random numbers, in accordance with an embodiment of the present invention.

In various embodiments, an apparatus 100 includes a MTJ structure 110. The MTJ structure 110 can include, e.g., three layers. The first layer 102 is a free layer. The second layer 104 is a barrier layer. The third layer 106 is a reference layer. The free layer 102 and the reference layer 106 can be, e.g., ferromagnetic layers. The barrier layer 104 can be, e.g., an insulating layer.

The MTJ 110 can be connected to a voltage source 120. The voltage source 120 can provide a bias voltage to the MTJ 110. The voltage can also be designated as $V_{bias}$.

The MTJ 110 can further be connected to a time-to-amplitude converter 130 via a pulse height discriminator 125. The random flipping of the magnetization in the free layer causes pulses of current to flow through the circuit. The pulse height discriminator 125 and the time-to-amplitude converter 130 convert these pulses, via digital circuitry 140, into a random number 145 (e.g., 100101101). As noted, the random number 145 can be in the form of a series of 1s and 0s.

The barrier layer 104 is a very thin layer. In one example, the energy barrier between the two states can be in the order of about 20 kT (thermal activation energy). Thus, the thermal noise in the system is sufficient to flip the magnetization in the free-layer in a random fashion (thermal activation energy, where k is the Boltzmann constant and T is the absolute temperature).

Magnetic Tunneling Junction (MTJ) devices include two ferromagnetic films, or plates, separated by a thin insulating layer to form magnetic storage elements. It will be recognized that the magnetic material can be any suitable material, combination of materials, or alloy that exhibits magnetic properties, such as a ferromagnetic material or a ferromagnetic thin film including CoFe, CoFeB, NiFe, etc. By sharing magnetic random access memory (MRAM) manufacturing processes with magnetic film integration techniques, the embodiments described herein can more efficiently provide integrated magnetic field enhanced circuit elements.

The MTJ stacks include two layers of ferromagnetic material separated by a thin insulating tunnel barrier layer. The insulating layer is sufficiently thin that quantum-mechanical tunneling of the charge carriers occurs between the ferromagnetic electrodes. The tunneling process is electron spin dependent, which means that the tunneling current across the junction depends on the spin-dependent electronic properties of the ferromagnetic materials and is a function of the relative orientation of the magnetic moments (magnetization directions) of the two ferromagnetic layers. The two ferromagnetic layers can be designed to have different responses to magnetic fields so that the relative orientation of their moments can be varied with an external magnetic field or by the tunneling current itself.

Figure 2:
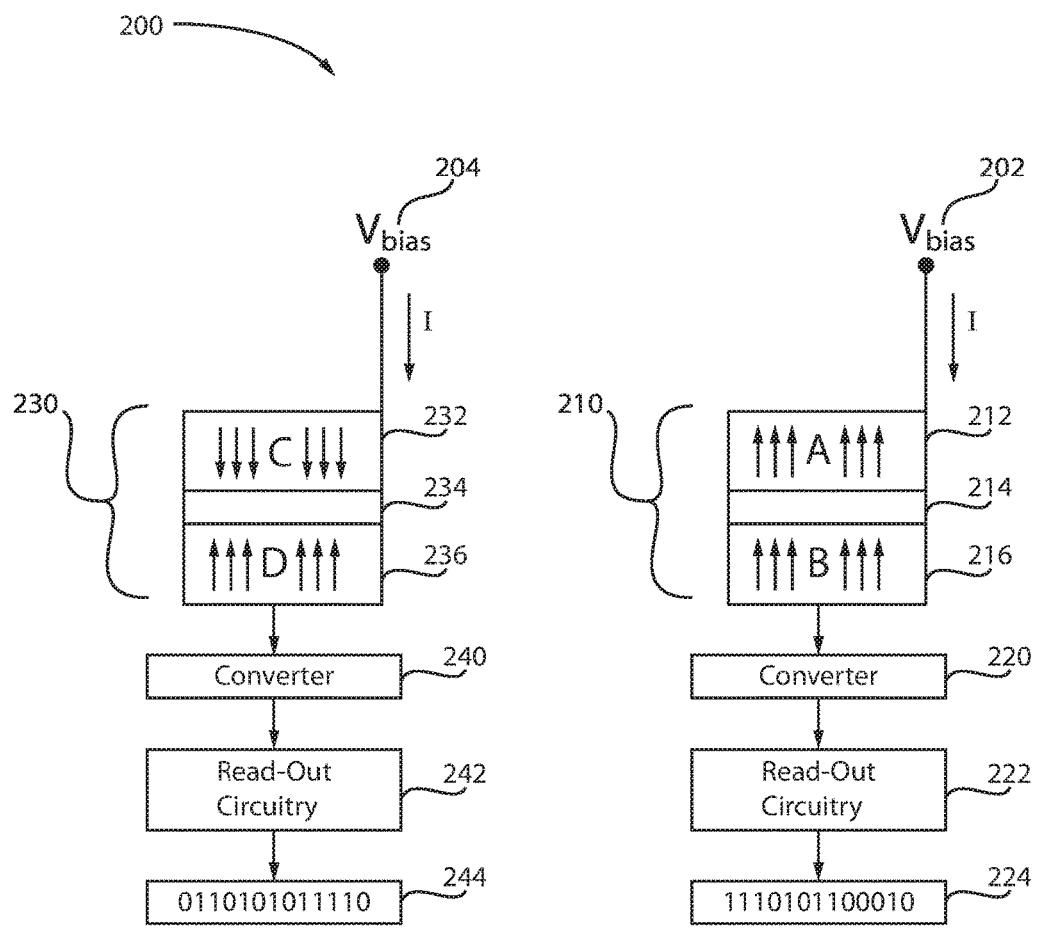
FIG. 2 depicts MTJ structures in a high resistance (left) and low resistance (right) state, in accordance with an embodiment of the present invention.

FIG. 2 depicts MTJ structures in a high resistance (left) and low resistance (right) state, in accordance with an embodiment of the present invention.

In various embodiments, a system 200 is presented with one apparatus used for outputting a high bit (e.g., 1) and one apparatus used for outputting a low bit (e.g., 0).

MTJ 210 includes at least a ferromagnetic free layer 212 and a ferromagnetic reference (e.g., pinned) layer 216. Free layer 212 and reference layer 216 can be separated by a non-magnetic spacer layer 214, which is an insulating barrier sufficiently thin that electrons can tunnel through it from reference layer 216 to free layer 212. This is called tunnel magnetoresistance (TMR). The magnetization orientation of reference layer 216 is pinned in a predetermined direction (as indicated by the single arrow) while the magnetization orientation of free layer 212 is free to rotate.

MTJ 230 includes at least a ferromagnetic free layer 232 and a ferromagnetic reference (e.g., pinned) layer 236. Free layer 232 and reference layer 236 can be separated by a non-magnetic spacer layer 234, which is an insulating barrier sufficiently thin that electrons can tunnel through it from reference layer 236 to free layer 232. This is called tunnel magnetoresistance (TMR). The magnetization orientation of reference layer 236 is pinned in a predetermined direction (as indicated by the single arrow) while the magnetization orientation of free layer 232 is free to rotate.

The magnetization orientations of free layers and reference layers can be either parallel or anti-parallel relative to each other. For example, the magnetization orientations of the free layer 212 and the reference layer 216 can be parallel to each other, whereas the magnetization orientations of the free layer 232 and the reference layer 236 can be anti-parallel to each other. The two states of the free layer 212 or 232 can be separated in energy in the order of about 20 kT (thermal activation energy). It is noted that the energy barrier (Eb) is selected to be as low as possible. The state of the free layer 212 or 232 can be flipped by an external field, by an electrical current passing through it, or by thermal energy. In the exemplary embodiments of the present invention, a low Eb can be used to create a system that can flip between two states in a random fashion in the order of nanoseconds. Stated differently, the flipping of the magnetization in the free layer 212 or 232 causes the current going through the system to change randomly. The time the free layer 212 or 232 spends in, say, parallel orientation, which allows more current through the system, is random. The time-to-amplitude converter 130 converts these random pulse arrivals into voltage pulses that with the help of some digital circuitry 140 can be converted into a bit stream 145 (e.g., 00110101).

Therefore, a low energy barrier, such as in the range of about 20 kT, is used to cause flipping of an orientation of magnetization of the free layer. A small voltage is applied to the MTJ to read, not to flip the orientation of magnetization of the free layer. The instances of flips can be recorded as a current, I. The flips are random. The flips can also be constant, occurring, for example, every few nanoseconds. The current, I, is the difference in energy for having the arrows "A" or "C" in FIG. 2 point up or down. The flips cause a "blip" in the current, I. The blips cause the random pattern to be generated and can be represented as "1s" and "0s." Therefore, the flips in the free layer cause changes (e.g., blips) in the current, I, which in turn can be used to create random bit-streams (e.g., 100110101).

The resistance, and thus the bit state, of MTJ 210 is determined by the relative orientation of the magnetization orientations of layers 212 and 216. MTJ 210 is in the low resistance state when the magnetization orientations of layers 212 and 216 can be parallel relative to each other and in the high resistance state when the magnetization orientations of layers 232 and 236 can be anti-parallel relative to each other. The low resistance state can represent a "0" bit and the high resistance state can represent a "1" bit, or vice versa.

The MTJ 210 is connected to a voltage source 202. The voltage source 202 generates a current "I" flowing to the MTJ 210. The MTJ 210 is further connected to a converter 220. The converter 220 is connected to read-out circuitry 222, which generates a random number 224. The voltage source 202 can be manipulated to control or generate a sufficient rate of flips. The flips can be in the order of nanoseconds (ns).

Similarly, the MTJ 230 is connected to a voltage source 204. The voltage source 204 generates a current "I" flowing to the MTJ 230. The MTJ 230 is further connected to a converter 240. The converter 240 is connected to read-out circuitry 242, which generates a random number 244. The voltage source 204 can be manipulated to control or generate a sufficient rate of flips. The flips can be in the order of nanoseconds (ns).

In order to generate a random number series, the magnetization orientation of free layer 212, 232 must be randomly switched and the resistance across MTJ 210, 230 must be periodically sampled in order to generate a series of bits. Thus, in one or more embodiments, random flipping of an orientation of magnetization of the first layer or free layer 212, 232 is induced by thermal fluctuations in the MTJ device. Stated differently, thermal agitation noise is used to randomly switch a magnetization orientation of the first layer or free layer 212, 232.

Thermal stability determines how long the bit written in MTJ 210, 230 can be stored without error. Thermal stability is given by the following equation:

$$\Delta = E_b/k_B T.$$

where Eb is the energy barrier, $k_B$ is the Boltzmann constant, and T is the absolute temperature.

For reliable data storage in MRAM, the MTJ is designed to have two discrete, stable orientations, that is, the parallel and the anti-parallel configuration. Thermal stability factor refers to the stability of these two states. Each of the stable orientations has an associated energy level. The energy levels of both orientations are equivalent, but there is an energy barrier to overcome when switching from one orientation to the other. The stability of a given magnetic state over time is intrinsically linked to the magnitude of the energy barrier between the two possible stable orientations of magnetization. It is critical to observe that the ability to write to a new state is also intrinsically linked to the height of this energy barrier. During the write process, energy must be supplied to change the magnetization of the free layer in the desired direction. The greater the energy barrier between the two orientations, the greater the magnitude of the energy required for the writing process will be. This increase in writing energy being tied to the increase in stability originates the fundamental tension that exists between the factors controlling data retention time and the scalability of memory cell to smaller lithographic processes.

The retention time of a MTJ is a characterization of the expected time until a random bit-flip occurs and is determined by the thermal stability of the MTJ. High stability indicates the cell is unlikely to suffer from random bit-flips but makes it more difficult to write, requiring either higher currents or more time. The stability is estimated by the thermal stability factor (A).

As a result, the exemplary embodiments of the present invention utilize only thermal agitation, instead of spin transfer torque (STT), to randomly switch the orientation of the magnetization orientation of a free layer.

Moreover, what is important for MTJ device applications is the signal-to-noise ratio (SNR). The magnitude of the signal is dependent upon the magnetoresistance or MR ($\Delta R/R$) exhibited by the device. The signal is given by $i_B\Delta R$, which is the bias current ($i_B$) passing through the MTJ device (assuming a constant current is used to detect the signal) times the resistance change ($\Delta R$) of the device. However, the noise exhibited by the MTJ device is determined, in large part, by the resistance R of the device. It is well known that any conductor exhibits thermal noise commonly referred to as Johnson-Nyquist noise. The magnitude of the Johnson-Nyquist noise can be expressed as the root mean square voltage across the resistor, $V_J=(4k_B TR\Delta f)^{1/2}$. Thus if the noise introduced by the Johnson-Nyquist noise is the dominant noise source (e.g., the measurement electronics do not introduce any significant noise compared to the Johnson-Nyquist noise) then the SNR will be given by $i_B^2\Delta R^2/(4k_B TR\Delta f)$, where $k_B$ is Boltzmann's constant, T is the absolute temperature, R is the resistance of the device, and $\Delta f$ is the bandwidth of the measurement electronics. Thus to obtain the maximum SNR for constant power used to sense the device the resistance (R) of the device must be small and the change in resistance ($\Delta R$) of the device large.

The resistance of a MTJ device is largely determined by the resistance of the insulating tunnel barrier layer for a device of given dimensions since the resistance of the metal layers in the MTJ device, for example, the electrical leads and the ferromagnetic layers contribute little to the resistance. Moreover, because the sense current passes perpendicularly through the ferromagnetic layers and the tunnel barrier layer, the resistance of a MTJ device increases inversely with the area of the device.

The exemplary embodiments of the present invention utilize MTJs with a low barrier height (e.g., less than about 20 kT, thermal activation energy) by using only thermal agitation, instead of spin transfer torque (STT), to randomly switch the orientation of the magnetization orientation of a free layer to generate random numbers and to create a low-resistance MTJ. Thus, by controlling the barrier thickness or height, the MTJs can communicate with a time-to amplitude converter to generate a series of pulses, which can be sent to a read-out circuit to generate a true random generator.

Figure 3:
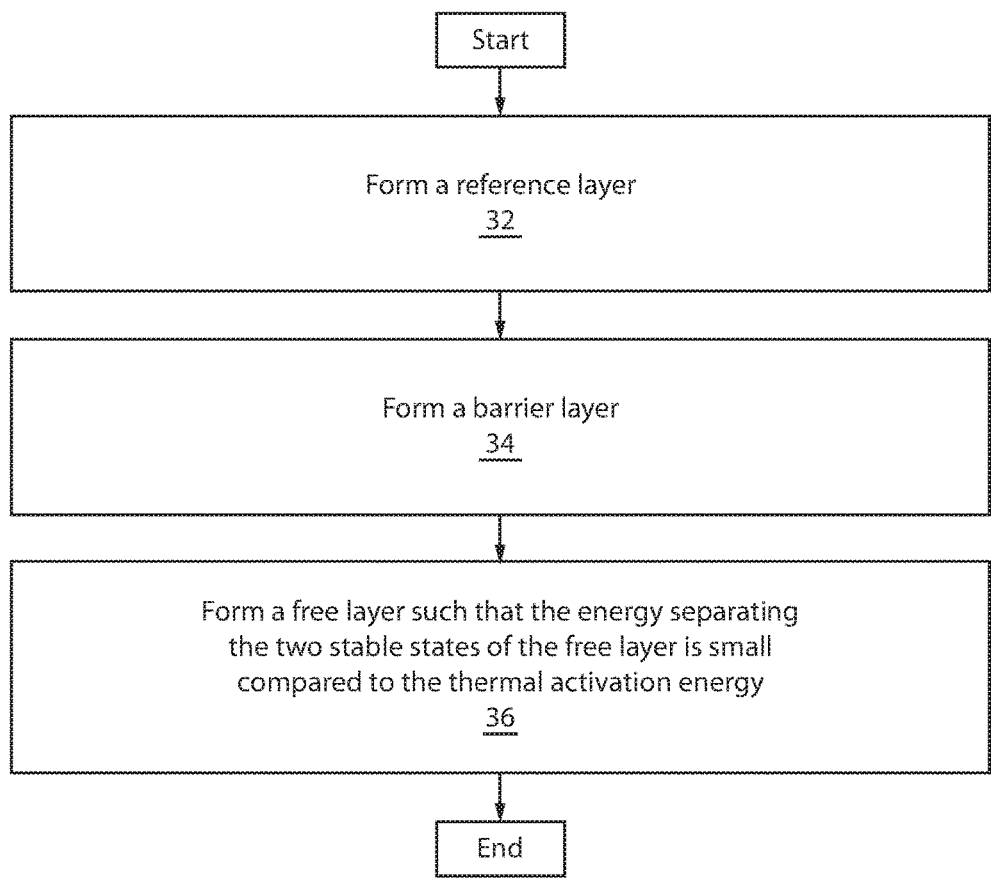
FIG. 3 is a block/flow diagram of an exemplary method for forming a barrier layer having an energy barrier of less than about 20 kT, in accordance with an embodiment of the present invention.

FIG. 3 is a block/flow diagram of an exemplary method for forming a barrier layer having an energy barrier of less than about 20 kT, in accordance with an embodiment of the present invention.

At block 32, a reference layer is formed.

At block 34, a barrier layer is formed. The barrier layer is formed over the reference layer.

At block 36, a free layer is formed wherein the energy separating the two stable states of the free layer is small compared to the thermal activation energy. Stated differently, the free layer includes a thermal activation energy difference such that states oscillate under a voltage bias to generate random outputs. When two conducting electrodes are separated by a thin dielectric layer with a thickness ranging from a few angstroms to a few nanometers, electrons can tunnel through the dielectric layer (often referred to as the tunnel barrier) resulting in electrical conduction.

Figure 4:
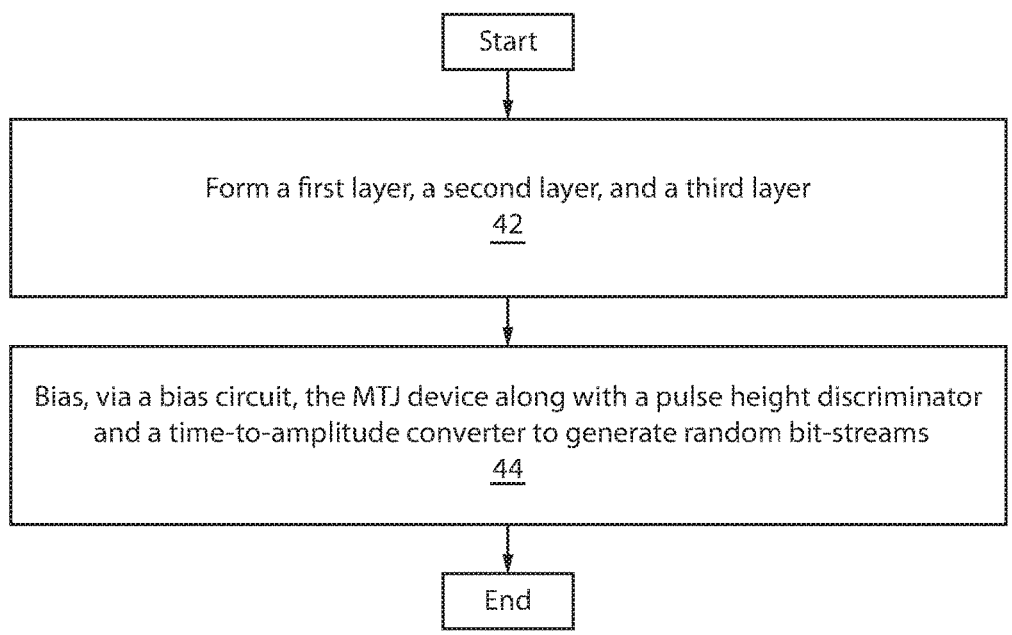
FIG. 4 is a block/flow diagram of an exemplary method for generating random number by thermal agitation noise, in accordance with an embodiment of the present invention.

FIG. 4 is a block/flow diagram of an exemplary method for generating random number by thermal agitation noise, in accordance with an embodiment of the present invention.

At block 42, a first layer, a second layer, and a third layer are formed. The first layer can be a reference layer, the second layer can be a barrier layer, and the third layer can be a free layer. The layers form a MTJ device. The MTJ device can be used as a true random number generator (TRNG).

At block 44, a bias circuit biases the MTJ device along with a pulse height discriminator and a time-to-amplitude convertor to generate random bit-streams. The random bit-streams can be in the form of "1s" and "0s."

In various embodiments, the materials and layers can be deposited by physical vapor deposition (PVD), chemical vapor deposition (CVD), atomic layer deposition (ALD), molecular beam epitaxy (MBE), or any of the various modifications thereof, for example plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). The depositions can be epitaxial processes, and the deposited material can be crystalline. In various embodiments, formation of a layer can be by one or more deposition processes, where, for example, a conformal layer can be formed by a first process (e.g., ALD, PE-ALD, etc.) and a fill can be formed by a second process (e.g., CVD, electrodeposition, PVD, etc.).

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method of device fabrication and a semiconductor device thereby fabricated to form magnetic tunnel junction (MTJ) based true random number generators (TRNG) (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of constructing a true random number generator (TRNG), the method comprising:
    forming a reference layer;
    forming a barrier layer; and
    forming a free layer, wherein energy separating two stable states of the free layer includes a thermal activation energy difference employed to flip an orientation of magnetization of the free layer to cause random current pulses that are converted to random outputs.

2. The method of claim 1, wherein the reference layer, the barrier layer, and the free layer form a stacked magnetic tunnel junction (MTJ) device.

3. The method of claim 2, wherein the MTJ device is biased by a voltage signal and the current pulses are converted into the random outputs by a pulse height discriminator and a time-to-amplitude converter.

4. The method of claim 3, wherein a bias circuit is configured to bias the MTJ device along with the pulse height discriminator and the time-to-amplitude convertor to generate the random outputs.

5. The method of claim 3, wherein the flipping of the orientation of magnetization of the free layer is induced by thermal fluctuations in the MTJ device.

6. The method of claim 3, wherein the random outputs are random bit streams.

7. The method of claim 2, wherein a terminal is coupled to the free layer to provide a bias voltage to the free layer.

8. The method of claim 2, wherein the reference layer and the free layer are ferromagnetic layers.

9. An apparatus for constructing a true random number generator (TRNG), the apparatus comprising:
    a magnetic tunnel junction (MTJ) device including:
        a reference layer;
        a barrier layer; and
        a free layer, wherein energy separating two stable states of the free layer a thermal activation energy difference employed to flip an orientation of magnetization of the free layer to cause random current pulses that are converted to random outputs.

10. The apparatus of claim 9, wherein an energy barrier height is in the order of 20 kT, where k is the Boltzmann constant and T is the absolute temperature.

11. The apparatus of claim 10, wherein a time-to-amplitude converter is connected to the MTJ device.

12. The apparatus of claim 11, wherein the time-to-amplitude converter generates the random outputs.

13. The apparatus of claim 11, wherein the flipping of the orientation of magnetization of the free layer is induced by thermal fluctuations in the MTJ device.

14. The apparatus of claim 11, wherein the random outputs are random bit streams.

15. The apparatus of claim 10, wherein a terminal is coupled to the free layer to provide a bias voltage to the free layer.

16. The apparatus of claim 10, wherein the reference layer and the free layer are ferromagnetic layers.

17. An apparatus for constructing a true random number generator (TRNG), the apparatus comprising:
    a magnetic tunnel junction (MTJ) device including a first layer, a second layer, and third layer; and
    a bias circuit to bias the MTJ device along with a pulse height discriminator and a time-to-amplitude convertor by flipping an orientation of magnetization of the third layer to cause random current pulses that are converted to random bit-streams.

18. The apparatus of claim 17, wherein the second layer is a barrier layer with an energy barrier height in the order of 20 kT, where k is the Boltzmann constant and T is the absolute temperature.

19. The apparatus of claim 17, wherein thermal agitation noise is further employed to randomly switch an orientation of magnetization of the third layer.

20. The apparatus of claim 17, wherein the random flipping of the orientation of magnetization of the third layer is induced by thermal fluctuations in the MTJ device.

* * * * *